United States Patent [19]
Plankenhorn

[11] Patent Number: 5,343,602
[45] Date of Patent: Sep. 6, 1994

[54] PROCESS FOR SEPARATING ACCELERATION SENSORS CONSTRUCTED AS DIFFERENTIAL CAPACITORS

[75] Inventor: Horst Plankenhorn, Villingen-Schwenningen, Fed. Rep. of Germany

[73] Assignee: Mannesmann Kienlze GmbH, Villingen, Fed. Rep. of Germany

[21] Appl. No.: 4,396

[22] Filed: Jan. 14, 1993

[30] Foreign Application Priority Data

Jan. 17, 1992 [DE] Fed. Rep. of Germany ....... 4201104

[51] Int. Cl.$^5$ .............................................. H01G 5/16
[52] U.S. Cl. .................... 29/25.41; 29/25.42; 29/413; 29/414; 361/280
[58] Field of Search ..................... 29/25.41, 25.42, 413, 29/414; 361/280, 321

[56] References Cited
FOREIGN PATENT DOCUMENTS 0369352 5/1990 European Pat. Off. .

Primary Examiner—Carl E. Hall
Attorney, Agent, or Firm—Anderson Kill Olick & Oshinsky

[57] ABSTRACT

A process for separating a glass-silicon-glass layer package wherein the glass-silicon-glass layer package is produced at a minimum process cost and is constructed from a plurality of acceleration sensors constructed with micro-mechanical structure techniques. At the same time, dirt is to be prevented from entering the acceleration sensors and the connection contacts are to be freed automatically. Separation is effected substantially by crosswise cutting and subsequent breaking. In order to prevent an "opening" of the acceleration sensors when cutting in one direction, i.e. transversely relative to the flexural resonators, and to achieve a defined breaking, one glass disk is cut until a predetermined breaking point is reached and the other glass disk is severed in a parallel plane. An intermediate layer which surrounds the connection in a U-shaped manner, serves as a blocking layer arranged between the two dividing planes and impedes a bonding of the glass disk and the silicon disk.

10 Claims, 5 Drawing Sheets

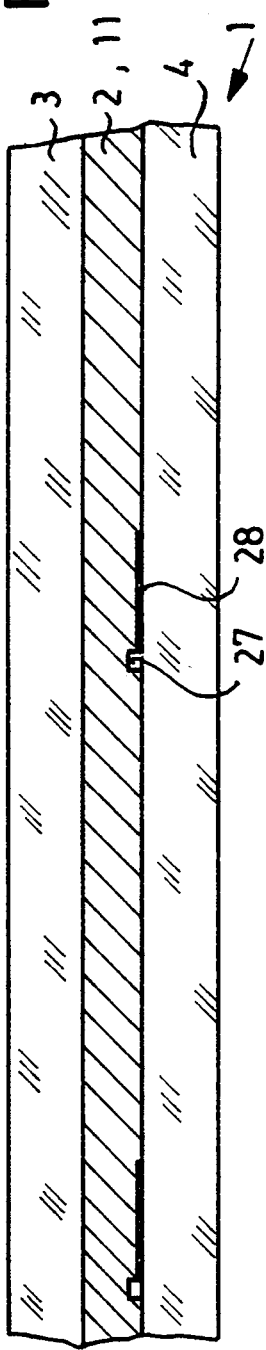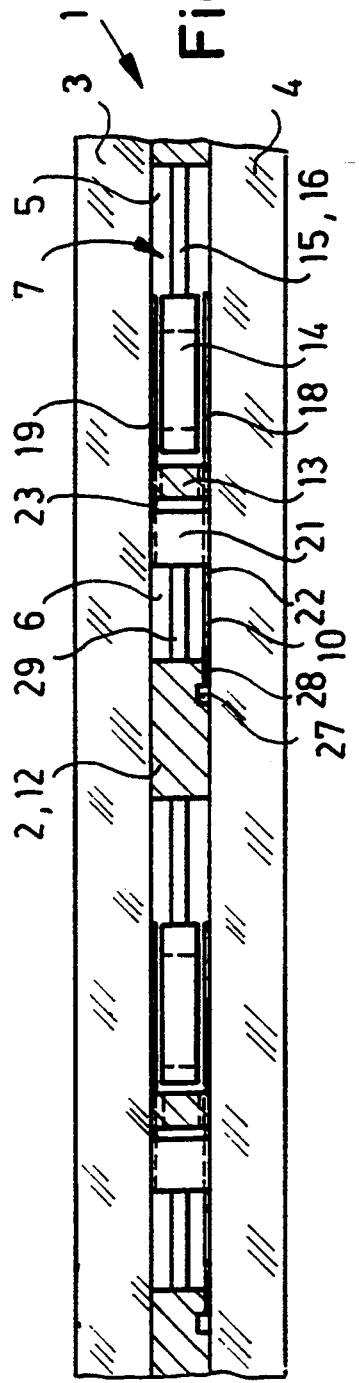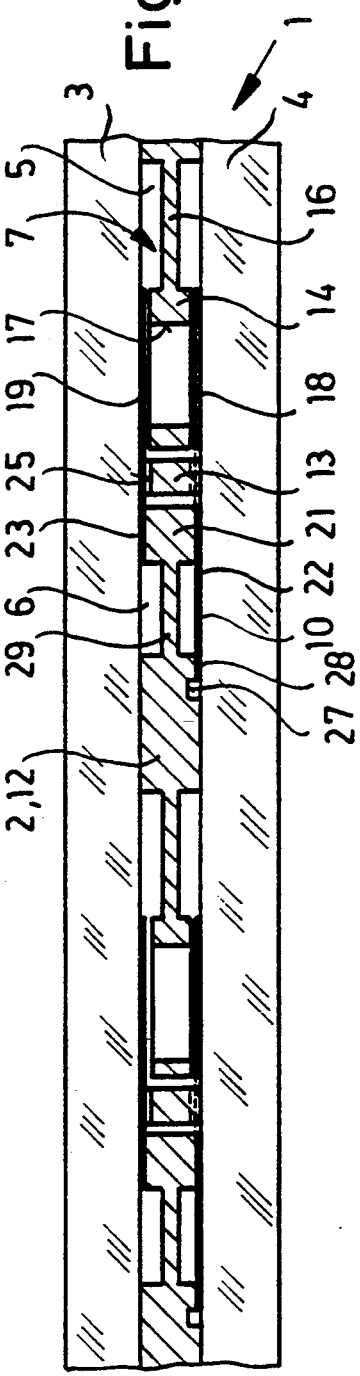

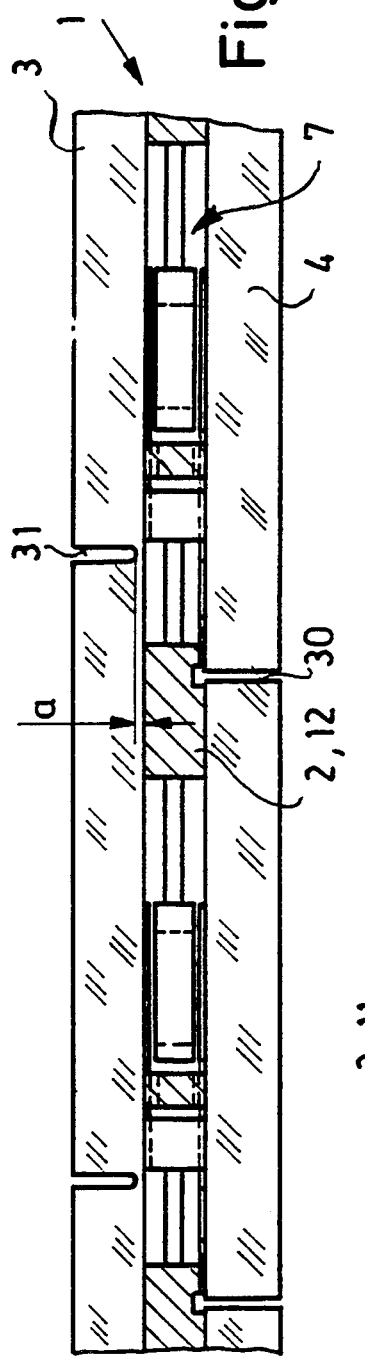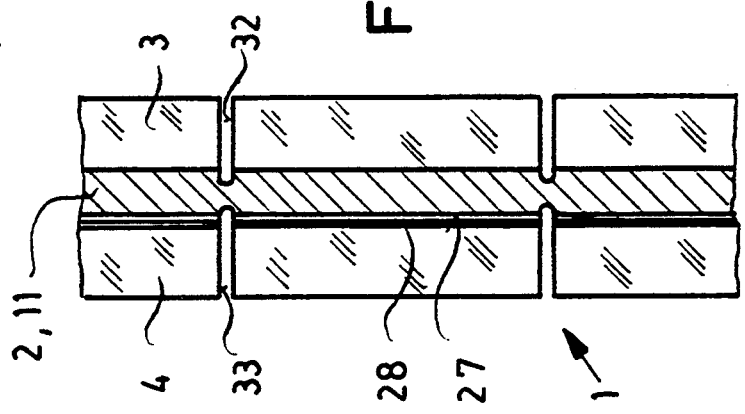

PROCESS FOR SEPARATING ACCELERATION SENSORS CONSTRUCTED AS DIFFERENTIAL CAPACITORS

FIELD OF THE INVENTION

The present invention pertains to a process and an apparatus for separating or for detaching acceleration sensors, which are constructed as differential capacitors and which are preferably produced from glass-silicon-glass layer packages. The disk-shaped silicon layer has a lattice or grid structure with flexural resonators, which are cut free from it and the glass disks, which are bonded with the silicon disk, carry metal layers which face the plate-shaped masses of the flexural resonators. The metal layers have substantially identical surface areas and are connected so as to be electrically conductive with connection contacts which are preferably arranged on a glass disk.

BACKGROUND OF THE INVENTION

A layer construction for micro-mechanical manufacture of capacitive acceleration sensors, specifically for manufacturing a plurality of sensors simultaneously, can be produced with a minimum of favorably reproducible process steps. For example, the resiliently movable masses, required for the operation sensing acceleration, are cut free from a p-type or from an n-type doped silicon disk. Recesses for the electrical insulation of conductor paths and for freeing the connection contacts are arranged on this silicon disk in a manner known per se by the multiple application of photolithographic structure techniques and anisotropic etching. The masses of the flexural resonators, which are formed in this manner, are compulsorily constructed in a plate-shaped manner and, as a result of the conductivity of the doped silicon disk, act as movable capacitor electrodes without the need for additional steps. The associated counter-electrodes, together with suitable conductor paths, are vapor-deposited on Pyrex glass disks or are structured out of metallized Pyrex glass surfaces by photolithographic techniques. The glass-silicon-glass layer package is then connected by anodic bonding.

This advantageous construction, for the production of the layer package, has a considerable disadvantage when separating the acceleration sensors. This is due to the fact that this construction, which is as simple as possible, dispenses with an evacuation of the spaces in which the flexural resonators are constructed and because the conductor paths, connecting the counter-electrodes with external connection contacts, are guided out through suitable cut out portions in the silicon disk, as for example, when the separated sensors are not hermetically sealed. On the other hand, the separation must also be carried out in conformity with the process, such as by numerically controlled diamond cutting disks. This entails the risk that the coolant or lubricant, and particularly dust, will enter the relatively narrow gaps, in the range of hundredths of millimeters, between the movable masses of the flexural resonators and the counter-electrodes and will either mechanically block the flexural resonators or cause short circuits.

Accordingly, there arises the problem of preventing the penetration of dirt, as described above, while carrying out the desired separation of the acceleration sensors, in conformity with the process, and that of freeing and making accessible the connection contacts in an exactly defined and reproducible manner and with the simplest possible sensor architecture, when carrying out the separation.

SUMMARY OF THE INVENTION

The present invention provides a process and an apparatus for separating acceleration sensors, which are constructed as differential capacitors, which overcomes the shortfalls in the prior art. The solution to the above-noted problem consists in that the glass-silicon-glass layer package is notched in a crosswise manner and reciprocal cuts are made, at least in one direction and in two parallel planes, in order to free the connection contacts. Also, an intermediate layer, which prevents a bonding connection, is provided between the crosspieces or webs of the grid-shaped silicon disk which serves to support the glass disks and the glass disk carrying the connection contacts prior to bonding, at least in an edge area, between the outer cutting plane, for freeing the connection contacts of an acceleration sensor. Further, the layer package is broken at the predetermined breaking points which are created by cutting.

The present invention provides the advantage that the hermetic closure of the acceleration sensors is lost only when breaking and the dust, which is caused by cutting, as well as the coolant residues, can accordingly be eliminated beforehand without special cost. Moreover, an exactly defined breaking of the silicon disk is achieved, on the one hand, without additional manufacturing cost, by cutting in a parallel offset manner, in connection with the intermediate layer, which prevents anodic bonding and which is applied simultaneously with the counter-electrode and, on the other hand, the connection contacts are exposed on an accessible bracket without surrounding silicon residue.

If all of the connection contacts are arranged adjacent to one another on a Pyrex glass disk, which makes it necessary to divert the conductor path from one Pyrex glass disk to the other, the length of the acceleration sensors may be reduced to a minimum while simultaneously bringing about a substantial simplification in the subsequent bonding of the conducting wires. However, for this purpose, it is necessary that the acceleration sensors be constructed in an alternating manner during manufacture rather than so as to face in one direction. With respect to the arrangement of the connection contacts in only one plane, it is particularly important that the line between one counter-electrode and the connection contact, which is associated with the latter in another plane, are formed, in the preferred embodiment, by way of steps which are typical of the process and that they are finally automatically insulated and/or isolated by breaking when carrying out the separation.

Accordingly, it is an object of the present invention to provide a process and an apparatus for separating acceleration sensors which are constructed as differential capacitors.

It is another object of the present invention to provide a process and an apparatus for separating acceleration sensors which are constructed as differential capacitors which provides the advantage that the hermetic closure of the acceleration sensors is lost only when breaking and that the dust, which is caused by cutting, as well as the cooling residues, can be eliminated beforehand without special cost.

It is another object of the present invention to provide a process and an apparatus for separating acceleration sensors which are constructed as differential capacitors whereby an exactly defined breaking of the silicon disk is achieved, on the one hand, without additional manufacturing cost, by cutting in a parallel offset manner, in connection with the intermediate layer, which prevents anodic bonding and which is applied simultaneously with the counter-electrode and, on the other hand, the connection contacts are exposed on an accessible bracket without surrounding silicon residue.

It is still another object of the present invention to provide a process and an apparatus for separating acceleration sensors which are constructed as differential capacitors whereby the length of the acceleration sensors may be reduced to a minimum while simultaneously bringing about a substantial simplification in the subsequent bonding of the conducting wires.

Other objects and advantages of the present invention will be made apparent to those persons skilled in the art upon a review of the Description of the Preferred Embodiment taken in conjunction with the Drawings which follow.

BRIEF DESCRIPTION OF THE DRAWINGS

In the drawings:

FIG. 2 illustrates a section according to section line A of the package illustrated in FIG. 1;

FIG. 3 illustrates a section according to section line B of the package illustrated in FIG. 1;

FIG. 4 illustrates a section according to section line C of the package illustrated in FIG. 1;

FIG. 5 illustrates a top view of the package of FIG. 1 with dividing cuts;

FIG. 6 illustrates a section according to section line D of the package illustrated in FIG. 5;

DESCRIPTION OF THE PREFERRED EMBODIMENT

Figure 1:
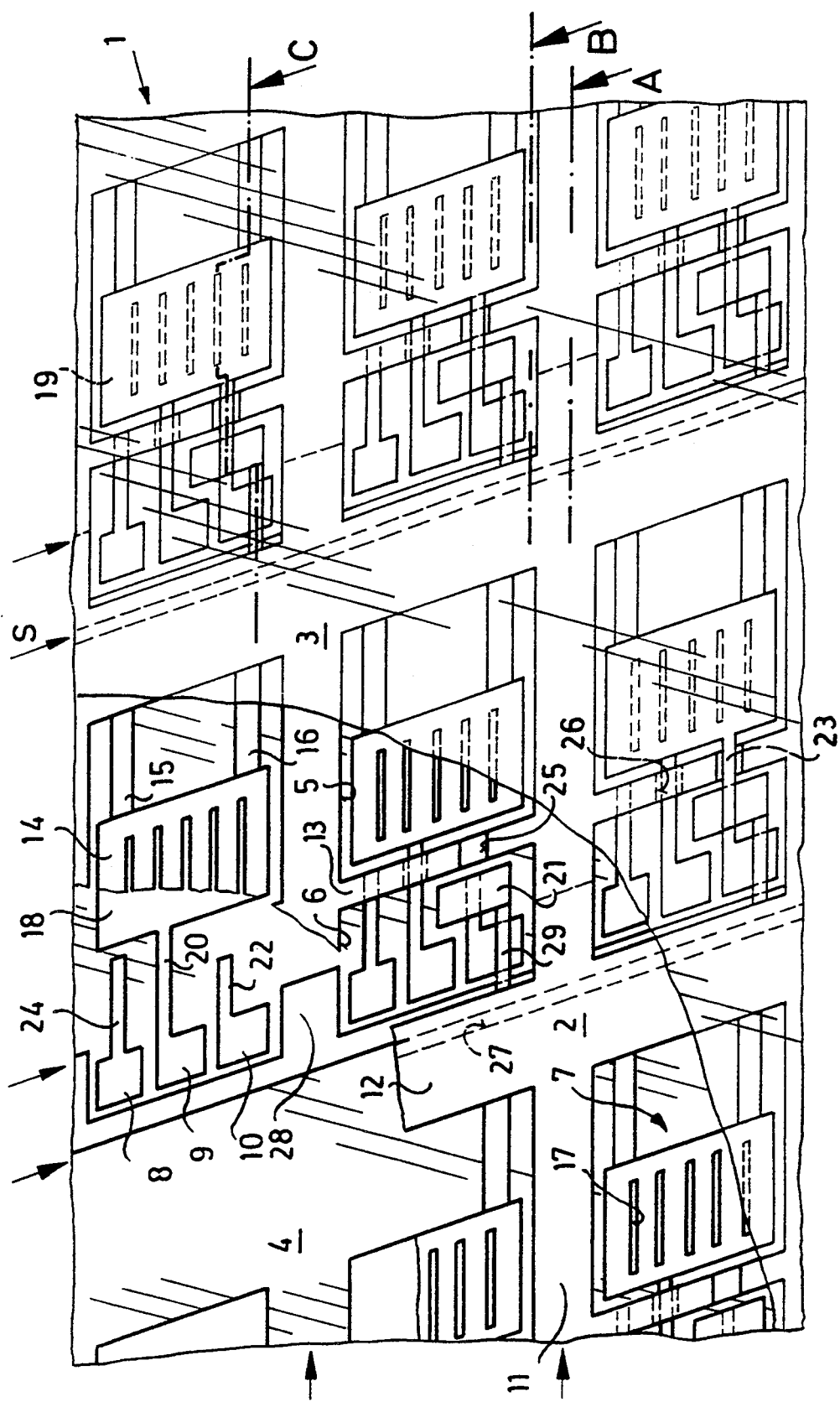
FIG. 1 illustrates a top view of a section of a bonded glass-silicon-glass layer package which is the subject of the present invention and which is broken into layers.

FIG. 1 illustrates a top view of a section of a bonded glass-silicon-glass layer package which is broken into layers and which is the subject of the present invention. As can be seen from the lozenge-shaped contours, according to the top view in FIG. 1, 110-oriented silicon disks are utilized for the production of the acceleration sensors. Accordingly, the advantages of the anisotropic etching technique, which is a considerably faster etching at right angles to the layer surface, may be utilized. This means that particularly narrow gaps may be etched, the surface area of the sensors may be minimized, and a relatively large number of slots, which serve to dampen the flexural resonator, may be arranged in the mass of the flexural resonator. At the same time, the surfaces of the mass of the flexural resonator, which surfaces are parallel to the disks and which act as an electrode, may be automatically constructed so as to have identical dimensions.

FIGS. 2, 3 and 4 illustrate sectional views of the package shown in FIG. 1 according to section lines A, B and C, respectively. As is also illustrated in the sectional views, which are enlarged by a scale of 3:1, the layer package 1 is constructed from a silicon disk 2, which is doped so as to enable conduction, and from Pyrex glass disks 3 and 4, which define the latter at both sides and which is assembled by bonding. As a result of the cut out portions 5 and 6 for the flexural resonator 7, as shown in FIGS. 3 and 4, and the connection contacts 8, 9 and 10, which are shown in FIG. 1 and which are to be freed when separating, the silicon disk 2 has a grid structure so that the Pyrex glass disks 3 and 4 rest only on longitudinal and transverse webs 11 and 12 of the grid-shaped silicon disk 2 and on narrow dividing walls 13 which are located between the cut out portions 5 and 6 and which are bonded with them.

As can further be seen from FIG. 1, the masses 14, of the flexural resonators 7, are connected with the transverse webs 12 via two arms 15 and 16 which are of a resilient construction. Slots, one of which is designated by the reference numeral 17, which are arranged in the masses 14, serve to optimize the frequency behavior as air flow paths which may be for an approximately aperiodic damping and a reduction in the response time of the respective flexural resonator 7. They may be realized at no extra cost and may have practically no influence on the capacitor function. Counter-electrodes 18 and 19, which may be formed of aluminum, are preferably associated with the masses 14 acting as electrodes and are vapor-deposited on the Pyrex glass disks 3 and 4 so as to conform to the masses 14 in surface area. The electrical connections of the counter-electrodes 18 with the connection contacts 9 are effected by conductor paths 20, which are arranged on the Pyrex glass disk 4 so as to conform in surface area. When electrically connecting the counter-electrodes 19 with the connection contacts 10, it is necessary to deflect from one plane into another plane. This is effected by means of silicon blocks 21 which are bonded with the Pyrex glass disks 3 and 4 and, in so doing, couple conductor paths 22 and 23 by pressure contact. The connection contacts 8 and the conductor paths 24, which proceed therefrom, are likewise pressure-contacted, specifically with the silicon disk 2. For example, they are situated between the dividing walls 13 and the glass disk 4. On the other hand, cut out portions 25 and 26, which are constructed in the dividing walls 13, serve to insulate the conductor paths 20 and 23 relative to the silicon disk 2.

Grooves 27 are constructed in the transverse webs 12 of the silicon disk 2 so as to be parallel to the webs and serve for the purpose of completely cutting free the glass disk 4, on the one hand, without the silicon disk 2 being cut by a cutting disk during separation, and on the other hand, for providing the advantage of having a division between the bond surfaces of the transverse webs 12 and the intermediate layers 28, which impede bonding. This division is reliable and compensates for tolerances. The intermediate layers 28, which are arranged on the glass disk 4 at the same time as the connection contacts 8, and 10, the conductor paths 20, 22 and 24, and the counter-electrodes 18 consist of aluminum in the preferred embodiment and preferably also overlap the longitudinal webs 11 so that the connection contacts 8, 9 and 10 of every acceleration sensor are surrounded within the glass-silicon-glass layer package by a U-shaped region, which is not bonded between the respective glass disk and the silicon disk.

For the sake of completeness, it is noted that the silicon blocks 21 are connected with the transverse webs 12 via arms 29, which are etched out in a suitable manner. This connection must be effected in such a manner that it breaks when the acceleration sensors are separated and the silicon blocks 21 are exclusively conducting members between the counter-electrodes 19 and the connection contacts 10.

Figure 7:
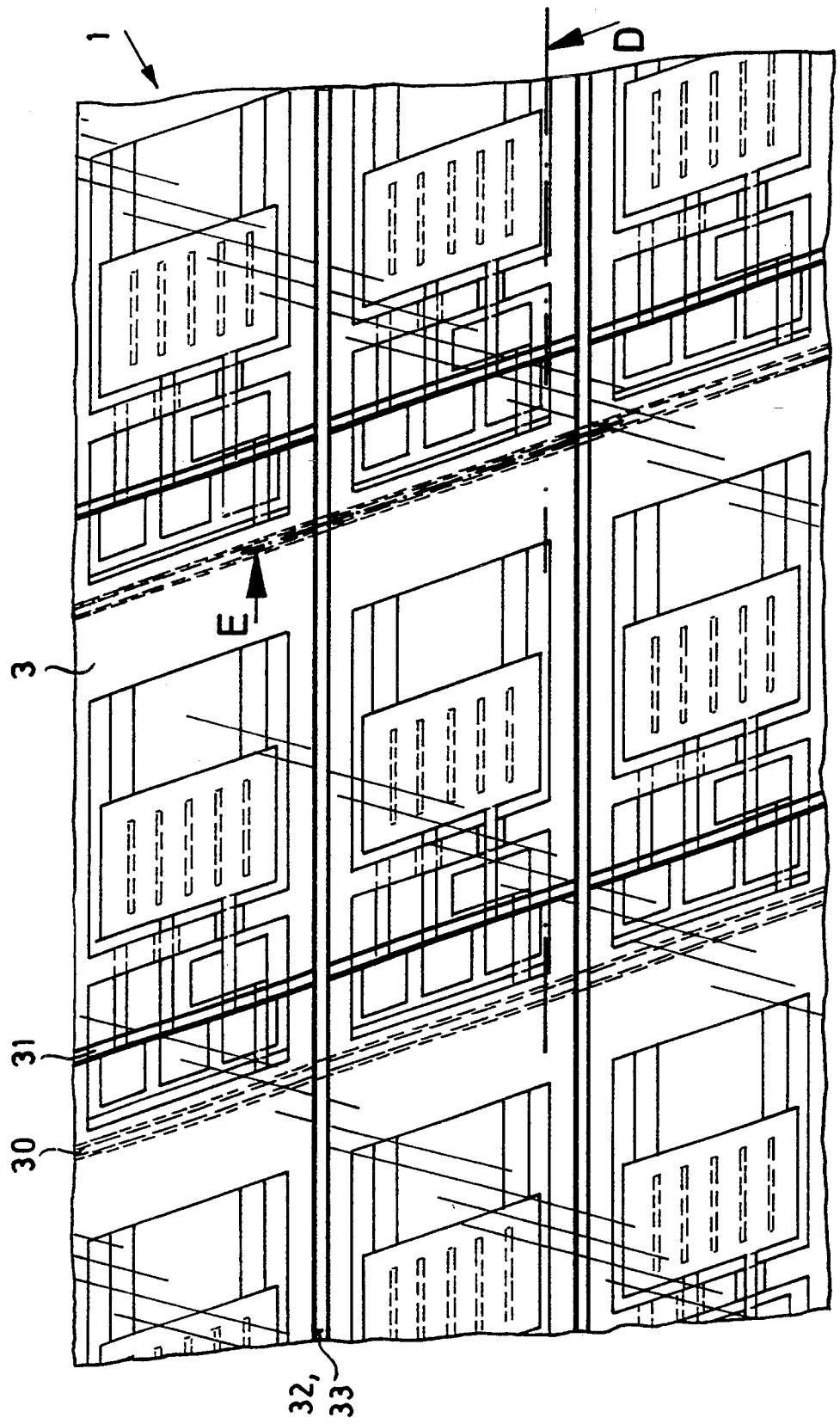
FIG. 7 illustrates a section according to section line E of the package illustrated in FIG. 5.

The arrows which are illustrated in FIG. 1, one of which is designated by the reference letter S, indicate the planes in which the dividing cuts are to be made for the separation of the acceleration sensors. The dividing cuts, which completely cut through the glass disk 4, as described above, are designated by the reference numeral 30 in the top view of the package which is illustrated with dividing cuts in FIG. 5 and in the sectional view thereof which is illustrated in FIG. 6. In contrast, a cut is made in the opposite glass disk 3 until a predetermined breaking thickness, denoted by the reference letter a, is achieved by means of dividing cuts 31 which extend parallel to the dividing cuts 30. FIG. 7 illustrates a sectional view according to the section line E which is illustrated in FIG. 5 and which shows dividing cuts 32 and 33 which extend transversely relative to the dividing cuts 30 and 31 and engage in the longitudinal webs 11.

FIGS. 6 and 7 clearly illustrate that no dirt may penetrate into the acceleration sensors when cutting. Only when the layer package is subsequently pressed on a resilient base, for example, by means of a roller which moves in a crosswise manner and which results in a breaking of the layer package 1 and, accordingly, in a separation of the acceleration sensors, are the connection contacts of the respective acceleration sensor exposed. Further, the electrical connection between the connection contact 10 and the counter-electrode 19 is insulated and the cut out portion 5, in which the flexural resonator 7 is located, is also opened outward via the cut out portions 25 and 26.

Figure 8:
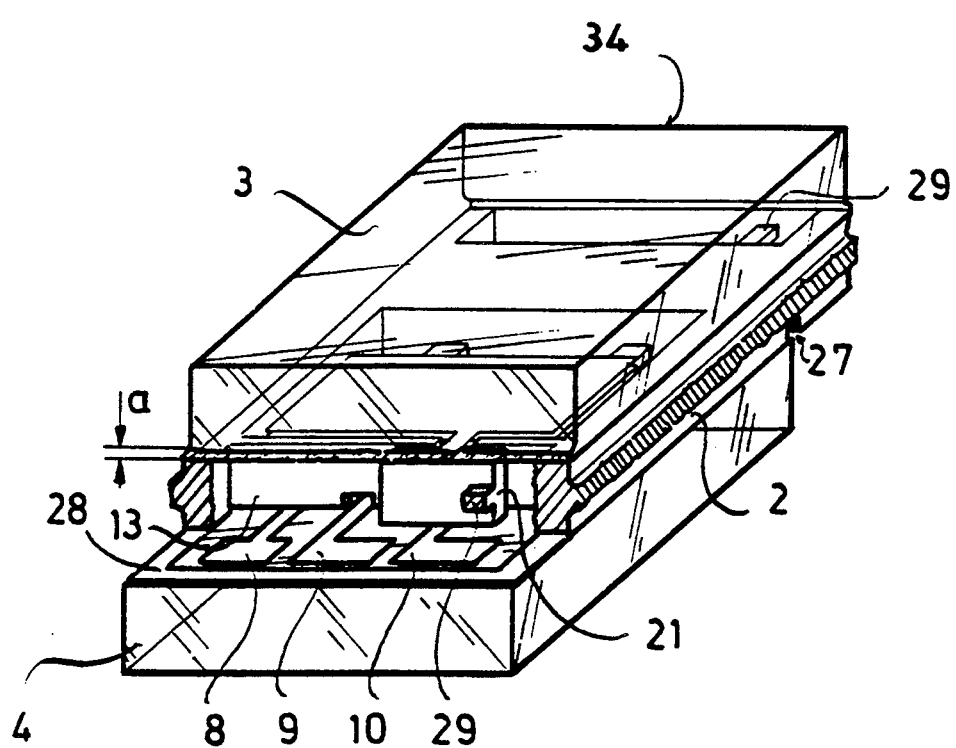
FIG. 8 illustrates a perspective view of a separated acceleration sensor.

FIG. 8 illustrates a separated acceleration sensor. In particular, FIG. 8 illustrates the importance of the intermediate layer, which acts as a blocking [depletion]layer in cooperation with the groove 27, and of the cutting which is performed completely through the glass disk 4. A slight bending of the layer package suffices to break the predetermined breaking points which are shown by the hatching in FIG. 8, and simultaneously, to free the connection contacts 8, 9 and 10 so as to provide a good access to them.

In the described arrangement, in which the sensor structures face in one direction, no debris is produced when separating occurs. For this purpose, however, every acceleration sensor has a projection 34, which serves no purpose and, accordingly, unnecessarily lengthens the acceleration sensor. This disadvantage may be overcome if the sensor structures are located opposite one another and in an alternating manner. However, it must then be taken into account that a waste piece may be formed between the two acceleration sensors which share the connection contacts when separated. It is also possible to construct the connection contacts of the counter-electrodes in the same plane. In this case, an alternating arrangement of the sensor structures would be required if the same method of separation were utilized and a waste piece would be formed when separating occurs as is the case in the embodiment described above. However, this solution is less advantageous with respect to the bonding of the conducting wires.

While the present invention has been described in a preferred embodiment, it should be noted that such description is merely illustrative of the present invention and is not to be construed as a limitation thereof. Accordingly, the present invention encompasses all modifications, variations and/or alternate embodiments with the scope of the invention being limited only by the claims which follow.

I claim:

1. A process for separating acceleration sensors, which are constructed as differential capacitors and, which are produced from a glass-silicon-glass layer package, wherein a disk-shaped silicon layer has a grid structure with flexural resonators which are cut free therefrom, and further wherein a plurality of glass disks, which are bonded with the silicon disk, carry metal layers which face plate-shaped masses of the flexural resonators, and further wherein metal layers have substantially identical surface areas and are connected so as to be electrically conductive with connection contacts which are arranged on a glass disk, which comprises the steps of:

providing a notch in said glass-silicon-glass layer package in a cross-wise manner;

performing a first cutting operation so as to make first cuts, which are reciprocal cuts, at least in one direction and in two parallel planes in order to free said connection contacts;

providing an intermediate layer, for preventing a bonding connection, between webs of said silicon layer which serves to support said plurality of glass disks and, in particular, supports at least one of said plurality of glass disks which carries said connection contacts prior to bonding, at least in an edge area between an outer cutting plane, for freeing acceleration sensor connection contacts; and performing a breaking operation so as to break said layer package at predetermined breaking points which are created by at least one of said first cutting operation and a second cutting operation.

2. The process of claim 1, wherein said intermediate layer is provided so as to enclose said connection contacts in a U-shaped manner between said outer cutting plane which serves to free said connection contacts.

3. The process of claim 1, wherein said breaking operation is performed by performing a pressing operation against a resilient base.

4. The process of claim 1, wherein said breaking operation is performed by performing a pressing operation against a curved surface.

5. The process of claim 1, wherein said intermediate layer is a metallic layer which is applied simultaneously with a metallizing of at least one of said plurality of glass disks which carries said connection contacts.

6. The process of claim 1, which further comprises the step of forming grooves during an etching of said silicon layer, wherein said grooves lie in said outer cutting plane and define a contact with an intermediate layer associated therewith.

7. The process of claim 1, wherein at least one of said plurality of glass disks is completely severed and an opposite of said one of said plurality of glass disks is cut until a predetermined breaking thickness is reached so as to free said connection contacts.

8. The process of claim 1, wherein, in an arrangement of said connection contacts on one and a same of at least one of said plurality of glass disks, for a respective electrical connection between one of said connection contacts and a counter electrode of an acceleration sensor, which does not conform with respect to surface area, a silicon block is provided which is bonded with said plurality of glass disks with an intermediary of conductor paths proceeding from said counter electrode and said connection contact when said layer package is bonded.

9. The process of claim 1, wherein a mechanical connection of a silicon block with said silicon layer is constructed in such a manner that it breaks when said acceleration sensors are separated.

10. The process of claim 8, wherein a mechanical connection of a silicon block with said silicon layer is constructed in such a manner that it breaks when said acceleration sensors are separated.

* * * * *